United States Patent
Han et al.

(10) Patent No.: US 7,939,855 B2
(45) Date of Patent: May 10, 2011

(54) SEMICONDUCTOR DEVICE

(75) Inventors: Sang-Yeop Han, Ichon-shi (KR); Se-Ra Won, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/538,747

(22) Filed: Aug. 10, 2009

(65) Prior Publication Data

US 2009/0294770 A1    Dec. 3, 2009

Related U.S. Application Data

(62) Division of application No. 11/617,592, filed on Dec. 28, 2006, now Pat. No. 7,572,720.

(30) Foreign Application Priority Data

Mar. 20, 2006 (KR) .......... 10-2006-0025201

(51) Int. Cl.
*H01L 27/10* (2006.01)
(52) U.S. Cl. .......... 257/202; 257/57; 257/408; 438/303; 438/585
(58) Field of Classification Search .......... 257/57, 257/202, 408, E29.288; 438/303, 585, 587, 438/588
See application file for complete search history.

(56) References Cited

U.S. PATENT DOCUMENTS

| | | | |
|---|---|---|---|
| 4,672,410 A | 6/1987 | Miura et al. | |
| 5,510,639 A | 4/1996 | Okuda et al. | |
| 6,352,888 B1 | 3/2002 | Kim | |
| 6,504,232 B2 * | 1/2003 | Norstrom et al. | 257/587 |
| 6,548,388 B2 | 4/2003 | Hwang et al. | |
| 6,967,151 B2 * | 11/2005 | Song et al. | 438/587 |
| 2002/0132439 A1 | 9/2002 | Norstrom et al. | |
| 2004/0092115 A1 * | 5/2004 | Hsieh et al. | 438/694 |
| 2006/0202340 A1 * | 9/2006 | Park et al. | 257/758 |

FOREIGN PATENT DOCUMENTS

| KR | 10-2002-0074999 A | 10/2002 |
|---|---|---|
| KR | 10-2004-0059445 A | 7/2004 |

* cited by examiner

*Primary Examiner* — Phuc T Dang
(74) *Attorney, Agent, or Firm* — Kilpatrick Townsend & Stockton LLP

(57) ABSTRACT

A semiconductor device includes a substrate, first, second, and third gate lines disposed over the substrate, the first and second gate lines defining a first trench with a first aspect ratio, the second and third gate lines defining a second trench with a second aspect ratio, a first insulating layer formed to decrease the first and second aspect ratios, and a second insulating layer disposed over the first insulating layer to fill the first and second trenches.

6 Claims, 4 Drawing Sheets

SEMICONDUCTOR DEVICE

CROSS-REFERENCE TO RELATED APPLICATIONS

The present invention is a divisional of U.S. patent application Ser. No. 11/617,592, filed on Dec. 28, 2006, now U.S. Pat. No. 7,572,720, which claims priority of Korean patent application number 10-2006-0025201, filed on Mar. 20, 2006, both of which are incorporated by reference in their entireties.

BACKGROUND OF THE INVENTION

The present invention relates to a method for fabricating a semiconductor device, and more particularly, to a semiconductor device fabricated to insulate neighboring gate lines from each other.

With the increase in integration, limitations associated with the deposition of the insulating layer between gate lines become an important factor in determining the reliability of the semiconductor device. In the current fabrication method, as the gate line spacing gets smaller and the active regions get closer, a local step portion (or local step formation) is formed on the surface of an isolation structure insulating active regions from each other. A local step formation is formed when the isolation structure between two gates is unintentionally etched, causing the surface to become lower than the surrounding area. This local step formation leads to filling defects (e.g., voids) when depositing an insulating layer for insulating one gate line from another.

FIG. 1 illustrates a plan view of a typical semiconductor device. A device isolation structure 12 is formed on a substrate 11 to define an active region 13. A plurality of gate lines G are formed over the substrate 11.

FIG. 2 illustrates a cross-sectional view taken along cut plane A-A' of FIG. 1, showing the limitations in the typical semiconductor device. The gate lines G are formed over the device isolation structure 12. However, prior to forming the gate lines G, the device isolation structure 12 has different heights in different regions. For instance, numerous wet etchings including cleaning are performed prior to forming the gate lines G. During the wet etchings, interfacial regions between the active region 13 and the device isolation structure 12 are likely to be damaged.

The damage is greater in a narrow region B where the space between the neighboring active regions 13 is small than in a wide region C where the space between the neighboring active regions 13 is large. The reason for this behavior is that the loss of the device isolation structure 12 is great in the interfacial regions with the active region 13 in the narrow region B. In addition to this loss, as reference letter 'E' in FIG. 3 illustrates, the device isolation structure 12 defined between the neighboring active regions 13 is lost in a horizontal direction as much as a minimum distance between the active regions 13. In other words, the etching is done more heavily in the narrow region B than in the wide region C, thereby resulting in the greater loss of the device isolation structure 12 in the narrow region B.

Accordingly, even though the narrow region B and the wide region C are applied with the same number of wet etching, the loss of the device isolation structure 12 is much severe in the narrow region B than in the wide region C. As a result, the device isolation structure 12 has different height in different regions.

FIGS. 4A and 4B illustrate cross-sectional views showing a typical method for fabricating a semiconductor device.

Referring to FIG. 4A, a plurality of gate lines G are formed over the device isolation structure 12 of which part of the surface is removed to a depth D, and a gate spacer 14 is formed on both sidewalls of each of the gate lines G. An interlayer dielectric 15 is deposited on the resultant structure including the gate lines G.

Referring to FIG. 4B, a chemical mechanical polishing (CMP) or an etch back process is performed for planarizing the top surface of the interlayer dielectric 15 until the top surfaces of the gate lines G are exposed. As a result, neighboring gate lines G are insulated from each other.

As described above, according to the typical method, the surface loss of the device isolation structure 12 is not generated in a wide region C, whereas the device isolation structure 12 is removed to a depth D in a narrow region B where the space between the active regions is relatively small. As a result, a step formation is undesirably formed between the narrow region B and the wide region C. Thus, the gates formed around the narrow region B has a higher aspect ratio than the wide region C so that the interlayer dielectric 15 is not fully filled into the narrow region. This pattern may lead to a void V between the gate lines G, and a device failure may occur in subsequent manufacturing processes.

SUMMARY OF THE INVENTION

Embodiments of the present invention are directed to a fabrication method for improving the operating characteristics of a semiconductor device by reducing the voids in an interlayer dielectric which may be caused by an increased aspect ratio between gates.

In accordance with an aspect of the present invention, there is provided a semiconductor device, including: a substrate; first, second, and third gate lines disposed over the substrate, the first and second gate lines defining a first trench with a first aspect ratio, the second and third gate lines defining a second trench with a second aspect ratio; a first insulating layer formed to decrease the first and second aspect ratios; and a second insulating layer disposed over the first insulating layer to fill the first and second trenches.

In accordance with another aspect of the present invention, there is provided a method for fabricating a semiconductor device. The method includes: forming first, second, and third gate lines over a substrate, the first and second gate lines defining a first trench having a first aspect ratio, the second and third gate lines defining a second trench having a second aspect ratio; forming a conductive layer within the first and second trenches to decrease the first and second aspect ratios, the conductive layer providing a first material; and forming an insulating layer over the first material to fill the first and second trenches.

DESCRIPTION OF SPECIFIC EMBODIMENTS

Figure 1:
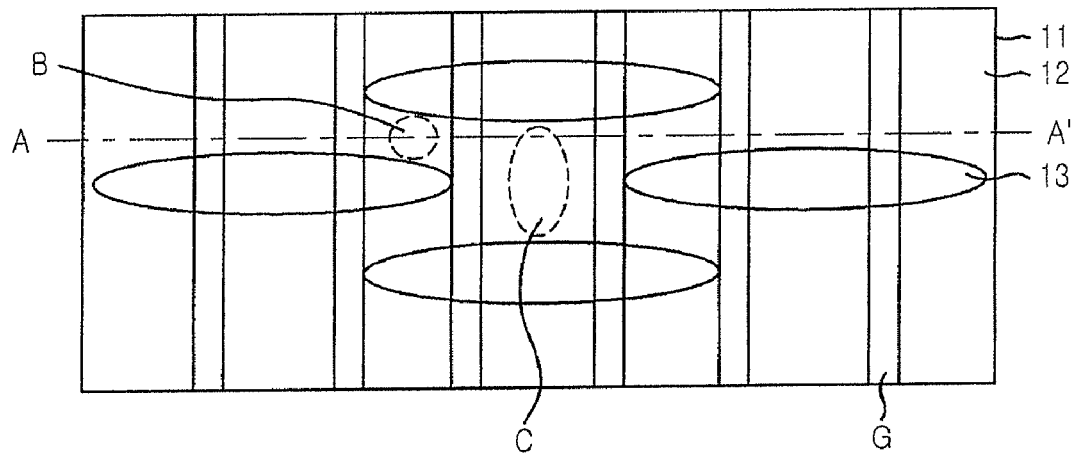
FIGS. 1 to 3 illustrate top views and a cross-sectional view of a typical semiconductor device.
Figure 2:
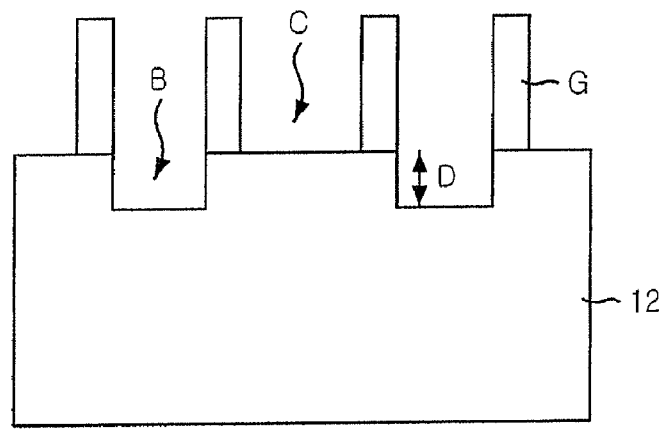
Figure 3:
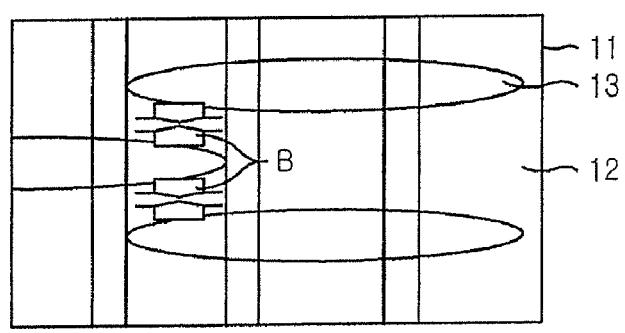
Figure 4A:
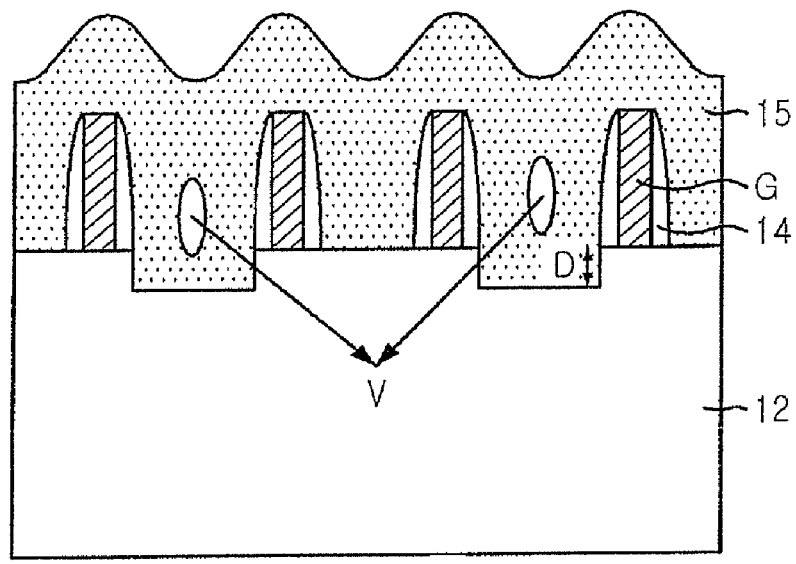
FIGS. 4A and 4B illustrate cross-sectional views showing a typical method for fabricating a semiconductor device.
Figure 4B:
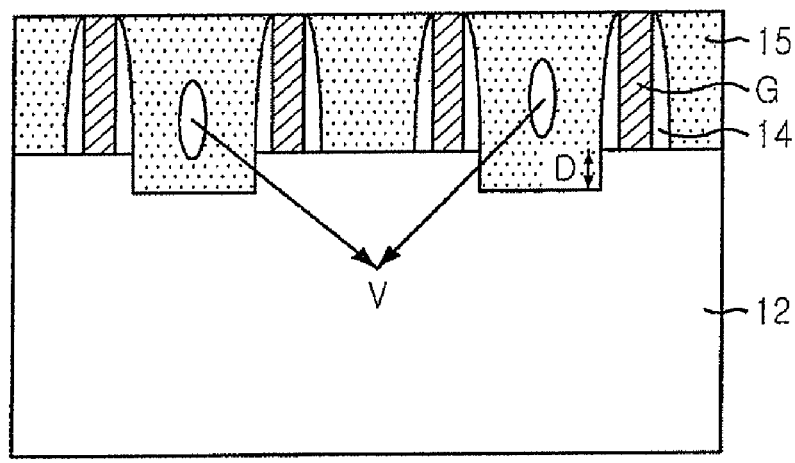
Figure 5A:
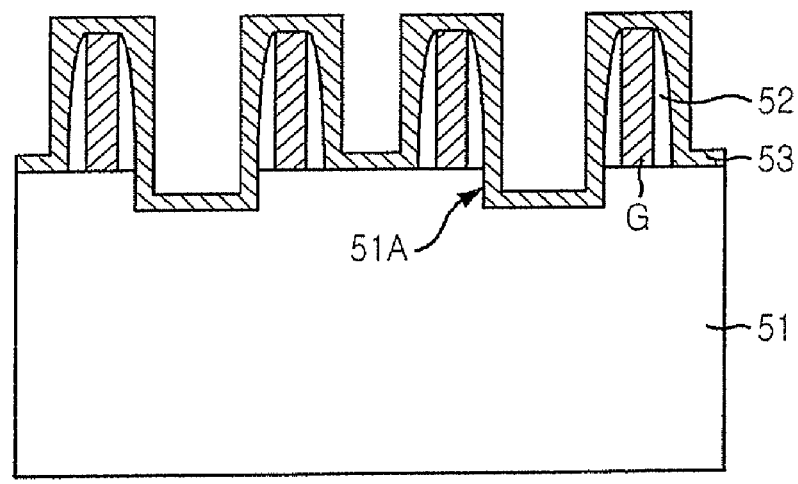
FIGS. 5A and 5D illustrate cross-sectional views showing a method for fabricating a semiconductor device in accordance with an embodiment of the present invention.
Figure 5B:
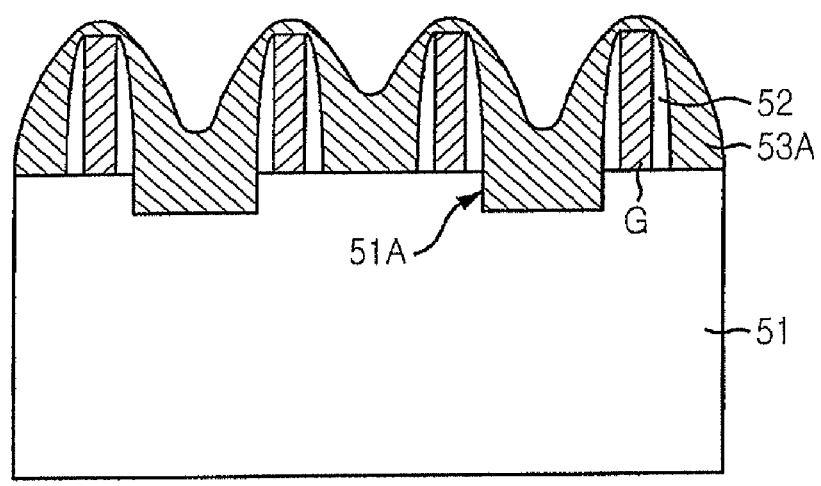
Figure 5C:
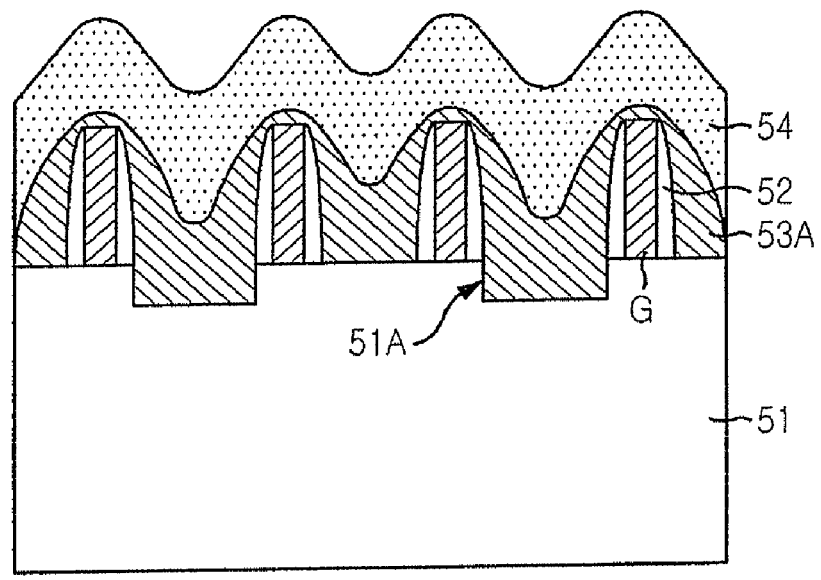
Figure 5D:
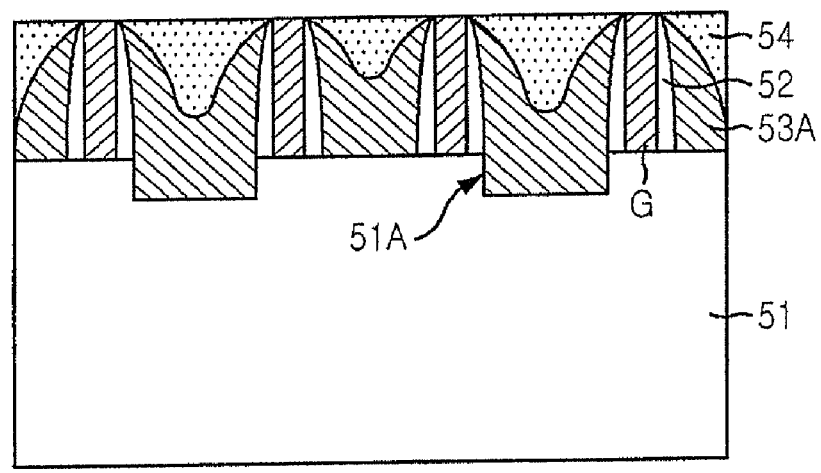

FIGS. 5A and 5D illustrate cross-sectional views showing a method for fabricating a semiconductor device in accordance with an embodiment of the present invention. FIGS. 5A and 5D illustrate cross-sectional views corresponding to the views taken along cut plane A-A' of FIG. 1.

Referring to FIG. 5A, a plurality of gate lines G are formed over a substrate in which an isolation structure 51 is formed to define an active region. The gate line G formed over the isolation structure 51 having a step formation 51A is explained below.

A spacer 52 is formed on both sidewalls of each of the plurality of gate lines G. The spacer 52 may be configured with a single layer or a multi-stacked layer including a nitride layer and/or an oxide layer.

A polysilicon layer 53 is deposited on the plurality of gate lines G and the isolation structure 51. The polysilicon layer 53, which will play a role in decreasing the aspect ratio between the gate lines, has a better step coverage than a typical insulating layer such as an oxide layer, a nitride layer or the like. Thus, the deposition thicknesses at a bottom and sidewalls are constant. That is, the polysilicon layer 53 is uniformly formed over the isolation structure 51 where the step formation 51A is formed, the gate lines G, and the isolation structure 51 where the step formation 51A is not formed. Herein, the polysilicon layer 53 may be formed to a thickness ranging from about 10 nm to about 100 nm. Although the polysilicon layer 53 with excellent step coverage is used as a material for decreasing the aspect ratio in the present invention, it is possible to achieve excellent step coverage when using a metal layer such as an aluminum layer or a zirconium layer.

Referring to FIG. 5B, a thermal treatment is formed for lowering the surface energy of the polysilicon layer 53. Therefore, the polysilicon layer 53 re-flows into the gaps between the gates. The re-flow process of the polysilicon layer 53 is performed in hydrogen ambient at a temperature ranging from about 300° C. to about 800° C. under a pressure ranging from about 10 mTorr to atmospheric pressure. Alternatively, plasma treatment may be performed in hydrogen ambient so as to reflow the polysilicon layer 53.

After the reflowing of the polysilicon layer 53, the polysilicon layer 53 is converted into an insulation material. This insulating process is performed by thermally treating the polysilicon layer 53 so that the polysilicon layer 53 is converted into a silicon nitride layer. In the present implementation, the thermal treatment is performed in nitrogen ambient at a temperature ranging from about 300° C. to about 800° C. under a pressure ranging from about 10 mTorr to atmospheric pressure.

The insulating process may also be performed in oxygen ambient. The thermal treatment performed in oxygen ambient converts the polysilicon layer 53 into a silicon oxide ($SiO_2$) layer. In the present implementation, the thermal treatment is performed in oxygen ambient at a temperature ranging from about 300° C. to about 800° C. under a pressure ranging from about 10 mTorr to atmospheric pressure. The thermal treatment in oxygen ambient may be simultaneously performed with the reflow process of the polysilicon layer 53. That is, when the thermal treatment is performed in both hydrogen and oxygen ambient, the polysilicon reflows and is converted into the silicon oxide layer in a single process.

Alternatively, the insulating process of the polysilicon layer 53 may be performed using plasma treatment instead of thermal treatment. For example, nitrogen or oxygen plasma treatment is formed at a temperature ranging from about 100° C. to about 600° C. under a pressure ranging from about 1 mTorr to about 10 mTorr. When converting the polysilicon layer 53 into the silicon oxide layer, hydrogen and oxygen plasma treatment may be performed in a single process.

Through the reflow and conversion processes, the polysilicon layer 53 is transformed into a first insulating layer 53A. The first insulating layer 53A may be the silicon nitride layer or the silicon oxide layer.

Once the first insulating layer 53A is formed by converting the polysilicon layer 53, the high aspect ratio caused by the step formation of the isolation structure 51 is decreased.

Referring to FIG. 5C, a second insulating layer 54 is deposited on the first insulating layer 53A for insulating between neighboring gate lines G. The second insulating layer 54 may be formed using an oxide-based insulating material such as boron phosphorous silicate glass (BPSG) or the like, which is well known to those skilled in the art.

Referring to FIG. 5D, a chemical mechanical polishing (CMP) or an etch back process is performed for planarizing the top surfaces of the first and second insulating layers 53A and 54 until the top surfaces of the gate lines G are exposed.

The interlayer dielectric between the gate lines G is layered with the first insulating layer 53A and the second insulating layer 54. Thus, even if a step formation exists in the isolation structure 51, it is possible to form a void-free insulating layer by decreasing the aspect ratio with the first insulating layer 53A before depositing the second insulating layer 54.

As described above, in order to prevent a gap-fill property of an insulating layer from being degraded when depositing the insulating layer for insulating the plurality of gate lines formed over the step formation between the device isolation region and the active region, the first insulating layer 53A is formed in advance by the deposition and insulating processes of the polysilicon layer so that the aspect ratio can be decreased. This makes it possible to prevent a void which may be generated while filling the second insulating layer 54.

The embodiments of the present invention include one or more of the following advantages. First, it is possible to prevent a filling defect such as a void which may be generated when forming an insulating layer due to the step formation of the isolation structure in a miniaturized semiconductor device. Second, it is possible to enhance an operating characteristic and reliability of a semiconductor device in view of a void-free insulating layer.

While the present invention has been described with respect to the specific embodiments, it will be apparent to those skilled in the art that various changes and modifications may be made without departing from the spirit and scope of the invention as defined in the following claims. For example, the present invention may be implemented to fill a trench having a high aspect ratio that does not have a step formation. The scope of the present invention should be interpreted using the appended claims.

What is claimed is:

1. A semiconductor device, comprising:
a substrate;
first, second, and third gate lines disposed over the substrate, the first and second gate lines defining a first trench with a first aspect ratio, the second and third gate lines defining a second trench with a second aspect ratio, wherein a depth of the first trench is different from a depth of the second trench;
a first insulating layer formed on the gate lines and over the substrate to decrease the first and second aspect ratios, wherein the first insulating layer is obtained by reflowing a conductive layer and converting the conductive layer into an insulating layer; and
a second insulating layer disposed over the first insulating layer to fill the first and second trenches.

2. The semiconductor device of claim 1, wherein the second insulating layer includes an oxide-based layer.

3. The semiconductor device of claim 2, wherein the conductive layer is deposited to a thickness ranging from about 10 nm to about 100 nm.

4. The semiconductor device of claim 2, wherein the conductive layer includes a polysilicon layer, an aluminum layer, a zirconium layer, or a combination thereof.

5. The semiconductor device of claim 2, wherein the first insulating layer includes one of a silicon oxide layer obtained by oxidizing a polysilicon layer or a silicon nitride layer obtained by nitridizing a polysilicon layer.

6. The semiconductor device of claim 1, further comprising a spacer formed on both sidewalls of the gate lines.

* * * * *